United States Patent

Mizuno et al.

[11] Patent Number: 4,777,228
[45] Date of Patent: Oct. 11, 1988

[54] BIAXIALLY ORIENTED PARAPHENYLENE SULFIDE BLOCK COPOLYMER FILM AND PROCESS FOR PRODUCING THE SAME

[75] Inventors: Toshiya Mizuno; Takao Ichii; Yo Iizuka, all of Iwaki, Japan

[73] Assignee: Kureha Kagaku Kogyo Kabushiki Kaisha, Tokyo, Japan

[21] Appl. No.: 944,509

[22] Filed: Dec. 22, 1986

Related U.S. Application Data

[63] Continuation-in-part of Ser. No. 858,851, Apr. 30, 1986, which is a continuation-in-part of Ser. No. 748,464, Jun. 25, 1985.

[30] Foreign Application Priority Data

Jun. 29, 1984 [JP] Japan ................. 59-134633
Aug. 27, 1984 [JP] Japan ................. 59-178016
Aug. 27, 1984 [JP] Japan ................. 59-178017
Dec. 27, 1985 [JP] Japan ................. 60-294681

[51] Int. Cl.$^4$ .......... B29C 47/00; B29C 55/12; B29C 55/14; C08G 75/14
[52] U.S. Cl. .................. 525/535; 264/235.6; 264/235.8; 264/289.3; 264/331.11; 428/419; 428/704; 525/537; 528/388
[58] Field of Search ............ 264/235.6, 235.8, 289.3, 264/290.2, 331.11; 428/419, 704; 524/609; 525/535, 537; 528/388

[56] References Cited

U.S. PATENT DOCUMENTS

| 3,869,433 | 3/1975 | Campbell | 528/388 |
| 3,869,434 | 3/1975 | Campbell et al. | 528/388 |
| 4,286,018 | 8/1981 | Asakura et al. | 528/388 X |
| 4,370,469 | 1/1983 | Deguchi et al. | 528/388 |
| 4,426,479 | 1/1984 | Deguchi et al. | 428/419 X |
| 4,501,713 | 2/1985 | Wright | 528/388 X |
| 4,629,778 | 12/1986 | Sugie et al. | 528/388 |

FOREIGN PATENT DOCUMENTS

| 52-12240 | 4/1977 | Japan . | |
| 55-34967 | 3/1980 | Japan | 264/290.2 |
| 55-34968 | 3/1980 | Japan | 264/290.2 |
| 55-38613 | 3/1980 | Japan . | |
| 55-111235 | 8/1980 | Japan . | |
| 56-62127 | 5/1981 | Japan | 264/290.2 |
| 56-62128 | 5/1981 | Japan | 264/290.2 |
| 58-208019 | 12/1983 | Japan | 264/235.8 |
| 59-5099 | 2/1984 | Japan . | |
| 59-5100 | 2/1984 | Japan . | |
| 59-22926 | 2/1984 | Japan . | |
| 61-14228 | 1/1986 | Japan . | |

Primary Examiner—Jeffery Thurlow
Assistant Examiner—Leo B. Tentoni
Attorney, Agent, or Firm—Oblon, Fisher, Spivak, McClelland & Maier

[57] ABSTRACT

Disclosed herein is a biaxially oriented paraphenylene sulfide block copolymer film showing a heat shrinkage of 0-2.0% at 100°-220° C., comprising a paraphenylene sulfide block copolymer essentially composed of recurring units (A):

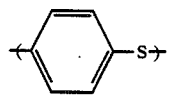

and recurring units (B):

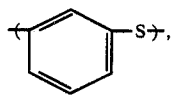

the molar fraction of recurring units (A) being 0.50–0.98, and having a melt viscosity ($\eta^*$) of 1,000–15,000 poises as measured at 310° C. and shear rate of 200 sec$^{-1}$, a glass transition temperature (Tg) of 20°–80° C., a crystalline melting point (Tm) of 250°–285° C. and a crystallization index (Ci) of 15–45 (measured with the non-stretched heat-treated polymer film), and a process for producing the biaxially oriented paraphenylene sulfide block copolymer film.

16 Claims, 1 Drawing Sheet

BIAXIALLY ORIENTED PARAPHENYLENE SULFIDE BLOCK COPOLYMER FILM AND PROCESS FOR PRODUCING THE SAME

CROSS-REFERENCE TO RELATED APPLICATION

The present application is a continuation-in-part of application Ser. No. 858,851 filed on Apr. 30, 1986 which is a continuation-in-part of application Ser. No. 748,464 filed on June 25, 1985.

BACKGROUND OF THE INVENTION

The present invention relates to a biaxially oriented paraphenylene sulfide block copolymer film showing a heat shrinkage of 0-2.0% at 100°-220° C. and a process for producing such film. More particularly, the present invention relates to a biaxially oriented paraphenylene sulfide block copolymer film showing a heat shrinkage of 0-2.0% at 100°-220° C., comprising a paraphenylene sulfide block copolymer essentially composed of recurring units (A):

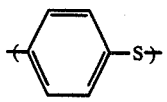

and recurring units (B):

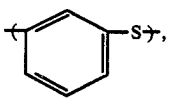

the molar fraction of recurring units (A) being 0.50-0.98, and having a melt viscosity ($\eta^*$) of 1,000-15,000 poises as measured at 310° C. and shear rate of 200 sec$^{-1}$, a glass transition temperature (Tg) of 20°-80° C., a crystalline melting point (Tm) of 250°-285° C. and a crystallization index (Ci) of 15-45 (measured with the non-stretched heat-treated polymer film), and a process for producing a paraphenylene sulfide block copolymer oriented film showing a heat shrinkage of 0-2.0% at 100°-220° C., which comprises melt extruding and molding said paraphenylene sulfide block copolymer into a film, stretching the thus molded film at a temperature of 85°-110° C., and heat-setting the thus stretched film at a temperature which is in the range of 250°-275° C. and further defined by the following formula:

$$200+15 \log \eta^* \leq T_{HS} \leq 182.5 + 22.5 \log \eta^*$$

(wherein $T_{HS}$ is heat-setting temperature, and $\eta^*$ is melt viscosity as measured at 310° C. and shear rate of 200 sec$^{-1}$).

Paraphenylene sulfide polymer is known as a thermoplastic resin having high heat-resistance and high chemical-resistance and excellent electrical properties since the paraphenylene sulfide polymer can be used at its working temperature as high as nearly the crystalline melting point (about 285° C.) by crystallizing it to a high degree because of its high crystallinity (see, for instance, Japanese Patent Publication No. 52-12240 (1977), Japanese Patent Publication No. 45-3368 (1970), Japanese Patent Application Layed Open (KOKAI) No. 59-22926 (1984) and U.S. Pat. No. 3,869,434). Also, some films made of such paraphenylene sulfide polymers and the processes for producing such films have been proposed.

For instance, there have been proposed a biaxially oriented poly-p-phenylene sulfide film containing more than 90% by mole of recurring units:

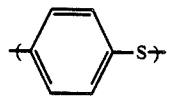

and having a density of 1.330-1.400 g/cc at 25° C., produced by melt extruding and molding a poly-p-phenylene sulfide having a melt viscosity in the range of 100-600,000 poises as measured at 300° C. and shear rate of 200 sec$^{-1}$ to form a non-crystalline (amorphous) transparent film, biaxially stretching the thus obtained film simultaneously or successively at 80°-120° C., and heat-setting the thus stretched film under tension at a temperature in the range from 180° C. to the melting point of the polymer (Japanese Patent Publication No. 59-5100 (1984); a biaxially oriented poly-p-phenylene sulfide film having a film-to-film kinematic friction coefficient of greater than 0.75 at 20° C. and 70% RH and a film surface roughness of less than 0.9μ/5 mm on the average, obtained by producing a poly-p-phenylene sulfide containing not less than 90% by mole of recurring units:

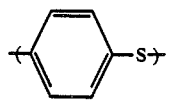

by polymerization, melt extruding and molding this polymer to form a non-crystalline (amorphous) film, biaxially stretching this film at a temperature of 80°-100° C. and heat-setting the thus biaxially stretched film at a temperature of 150°-280° C., wherein the particles of an inert inorganic material such as silica, alumina, carbon, glass, calcium carbonate, calcium phosphate or the like are added during or at the end of the polymerization, a determined amount of insoluble salt used in the polymerization is left, or the film is treated by a surface roughening roll in the film forming process or subjected to surface oxidation treatment or blast finishing with a solid matter (Japanese Patent Application Layed Open (KOKAI) No. 55-34968 (1980)); a process for producing a poly-p-phenylene sulfide film comprising melt extruding and molding poly-p-phenylene sulfide containing not less than 90% by mole of recurring units:

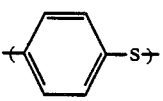

to form a substantially amorphous film, stretching this film by 2.0-5.0 times in one direction at 80°-120° C. to make the birefrigence index of the film 0.05-0.30, further stretching the thus obtained film by 1.5-5 times in the direction orthogonal to the initially stretched direction at a temperature of 80°-150° C., and heat-setting the thus treated film under tension at a temperature in the range from 180° C. to the melting point of the polymer (Japanese Patent Application Layed Open (KOKAI) No. 55-111235 (1980)); a process for producing a poly-p-phenylene sulfide film, comprising melting a poly-p-phenylene (amorphous) sulfide containing not less than 90% by mole of recurring units:

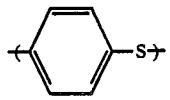

and having a melt viscosity of 100–600,000 poises as measured at 300° C. and shear rate of 200 sec$^{-1}$, extruding the melt onto a cooling medium having a surface temperture of 120° C. or below to form a film having a density of 1.320–1.330 g/cc, uniaxially stretching the thus obtained film by 3–4.7 times at 85°–100° C., then further stretching the thus stretched film by 2.7–4.5 times in the orthogonal direction to the initially oriented direction at 87°–110° C. and heat-setting the thus treated film at 200°–275° C. (Japanese Patent Application Layed Open (KOKAI) No. 56-62128 (1981)); a biaxially oriented poly-p-phenylene sulfide film having a gradient of 0.01–1.0 kg/mm$^2$/% at 20% elongation in the stress-strain curve when a 10 mm film piece cut out from said film in the longitudinal and transverse directions is stretched at a rate of 600%/min at 25° C., produced by melt extruding and molding a poly-p-phenylene sulfide containing not less than 90% by mole of recurring units:

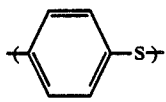

and having a melt viscosity of 300–100,000 poises as measured at 300° C. and shear rate of 200 sec$^{-1}$ to form a substantially amorphous film, biaxially stretching this film simultaneously or successively at a temperature of 80°–120° C., and heatsetting the thus stretched film under tension at a temperature in the range from 180° C. to the melting point of the polymer for 1–10 minutes (Japanese Patent Application Layed Open (KOKAI) No. 56-62127 (1981)); a process for producing a poly-p-phenylene sulfide film comprising melt extruding and molding poly-p-phenylene sulfide containing not less than 90% by mole of recurring units:

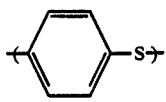

to form a non-crystalline (amorphous) poly-p-phenylene sulfide film, biaxially stretching this film at 80°–100° C., heat-setting the thus stretched film at 150°–280° C., and subjecting the thus treated film to a heat treatment at a temperature in the range below the heat-setting temperature but above 50° C. or subjecting the thus treated film to a heat treatment at a temperature in the range below the heat-setting temperature but above 50° C. while shrinking or stretching within 20% in the longitudinal and transverse directions (Japanese Patent Publication No. 59-5099 (1981)); and a base film for magnetic recording media having a Young's modulus not less than 250 kg/mm$^2$ at 20° C. at least in one direction and a thermal expansion coefficient in the range of $-2\times10^{-4}$–$2\times10^{-4}$ mm/(mm·°C.) in the temperature of 20°–150° C., produced by melt extruding a poly-p-phenylene sulfide containing not less than 90% by mole of recurring units:

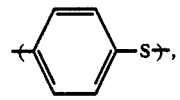

cold casting the thus obtained film, biaxially stretching the thus treated film simultaneously or successively and then subjecting the thus stretched film to crystallization heat treatment under tension at 180°–280° C. (Japanese Patent Application Layed Open (KOKAI) No. 55-38613 (1980)).

Paraphenylene sulfide polymer, however, has the problem that its crystallization rate is too high in the melting work and it tends to form coarse spherulites. For instance, in case of forming a film by the inflation method, the polymer crystallized and hardened before sufficient expansion occurs, and it is difficult to obtain a desired oriented film. Also, in case of extruding and molding the polymer into a sheet by a T-die, crystallization and hardening take place before the sheet is taken up on a take-up roll, and it is unable to obtain a flat and smooth sheet having a uniform thickness.

For overcoming these problems in working of paraphenylene sulfide polymer, there has been proposed an injection molding article, extrusion molding article or wire-coating article of a paraphenylene sulfide block copolymer essentially composed of recurring units (A):

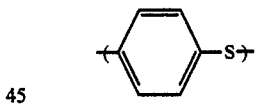

and recurring units (B):

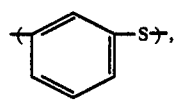

in which the recurring units A exist as a bonded block of average 20 to 5,000 units of the recurring unit (A) in the molecular chain and the molar fraction of recurring units (A) is in the range of 0.50–0.98, said copolymer having a melt viscosity ($\eta^*$) of 50–100,000 poises as measured at 310° C. and shear rate of 200 sec$^{-1}$, a glass transition temperature (Tg) of 20°–80° C., a crystalline melting point (Tm) of 250°–285° C. and a crystallization index (Ci) of 15–45 (measured with the non-oriented heat-treated polymer film) (Japanese Patent Application Laying Open (KOKAI) No. 61-14228 (1986)).

The paraphenylene sulfide block copolymer which is essentially composed of recurring units (A):

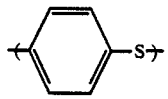

and recurring units (B):

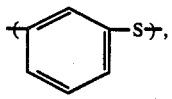

wherein the recurring units (A) exist as a bonded block of average 20–2,000 units of the recurring unit (A) in the molecular chain and the molar fraction of recurring units (A) is in the range of 0.50–0.98, and which has a melt viscosity ($\eta^*$) of 1,000–15,000 poises as measured at 310° C. and shear rate of 200 sec$^{-1}$, a glass transition temperature of 20°–80° C., a crystalline melting point of 250°–285° C. and a crystallization index of 15–45 (measured with the non-stretched heat-treated polymer film), has the same degree of crystallinity and heat resistance as paraphenylene sulfide homopolymer, is free of the problems in melt works of the homopolymer and also has a salient working characteristic that it can be well molded and worked even in a supercooling temperature range.

Recently, metallic thin-film tape is popularly used as magnetic tape for enhancing recording density. Fe, Ni, Co, their alloys and ferromagnetic compounds such as ferrite are used for the magnetic layer of the metallic thin-film tape. The thickness of the film is on the order of several micronmeters or less. In such metallic thin-film magnetic tape, it is important that the magnetic layer be fastly bonded on a plastic base film which has a certain limitation in heat resistance, without causing heat deterioration of the base film. Hitherto, polyester film has been used as such plastic base film.

However, the conventional polyester film is unsatisfactory in heat resistance. Also, this base film is subject to heat deterioration by the heat from the high-temperature evaporation (deposition) source and the latent heat of the magnetic atoms which come flying thereto in the course of vacuum evaporation (deposition). The examples of such heat deterioration are diversified from local creasing, pinholes and fusion to the serious flaws on the product. Under these circumstances, a new proposal of a film having excellent heat resistance for use as base film for metallic thin-film type magnetic tape has been desired.

As a result of studies on the subject matter, the present inventors found that by after stretching a paraphenylene sulfide block copolymer film, heat-setting the thus stretched film in a specific temperature range, it is possible to produce a biaxially oriented paraphenylene sulfide block copolymer film showing a proper degree of heat shrinkage, which film is free of the problem of heat deterioration by the heat from the high-temperature evaporation (deposition) source and the latent heat of the magnetic atoms coming flying thereto in the course of vacuum evaporation (deposition), and has easy melt workability, excellent dimensional stability at high temperatures and good coherence to the metallic rolls whereby the film cooling effect is increased and the rise of film temperature suppresses to the minimum in the course of vacuum evaporation (deposition). The present invention was attained on the basis of such finding.

SUMMARY OF THE INVENTION

In a first aspect of the present invention, there is provided a biaxially oriented paraphenylene sulfide block copolymer film showing a heat shrinkage of 0–2.0% at 100°–220° C., comprising a paraphenylene sulfide block copolymer essentially composed of recurring units (A):

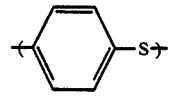

and recurring units (B):

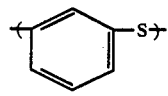

the molar fraction of recurring units (A) being 0.50–0.98, and having a melt viscosity ($\eta^*$) of 1,000–15,000 poises as measured at 310° C. and shear rate of 200 sec$^{-1}$, a glass transition temperature (Tg) of 20°–80° C., a crystalline melting point (Tm) of 250°–285° C. and a crystallization index (Ci) of 15–45 (measured with the non-stretched heat-treated polymer film).

In a second aspect of the present invention, there is provided a process for producing a biaxially oriented paraphenylene sulfide block copolymer film showing a heat shrinkage of 0–2.0% at 100°–220° C., comprising melt extruding and molding a paraphenylene sulfide block copolymer essentially composed of recurring units (A):

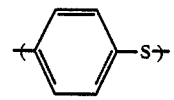

and recurring units (B):

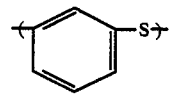

the molar fraction of recurring units (A) being 0.50–0.98, and having a melt viscosity ($\eta^*$) of 1,000–15,000 poises as measured at 310° C. and shear rate of 200 sec$^{-1}$, a glass transition temperature (Tg) of 20°–80° C., a crystalline melting point (Tm) of 250°–285° C. and a crystallization index (Ci) of 15–45 (measured with the non-stretched heat-treated polymer film), into a film, and after stretching the molded film, heat-setting the thus stretched film at a temperature which is in the range of 250°–275° C. and further defined by the formula:

$$200 + 15 \log \eta^* \leq T_{HS} \leq 182.5 + 22.5 \log \eta^*$$

(wherein $T_{HS}$ is heat-setting temperature, and $\eta^*$ is melt viscosity as measured at 310° C. and shear rate of 200 sec$^{-1}$).

DETAILED DESCRIPTION OF THE INVENTION

Figure 1:
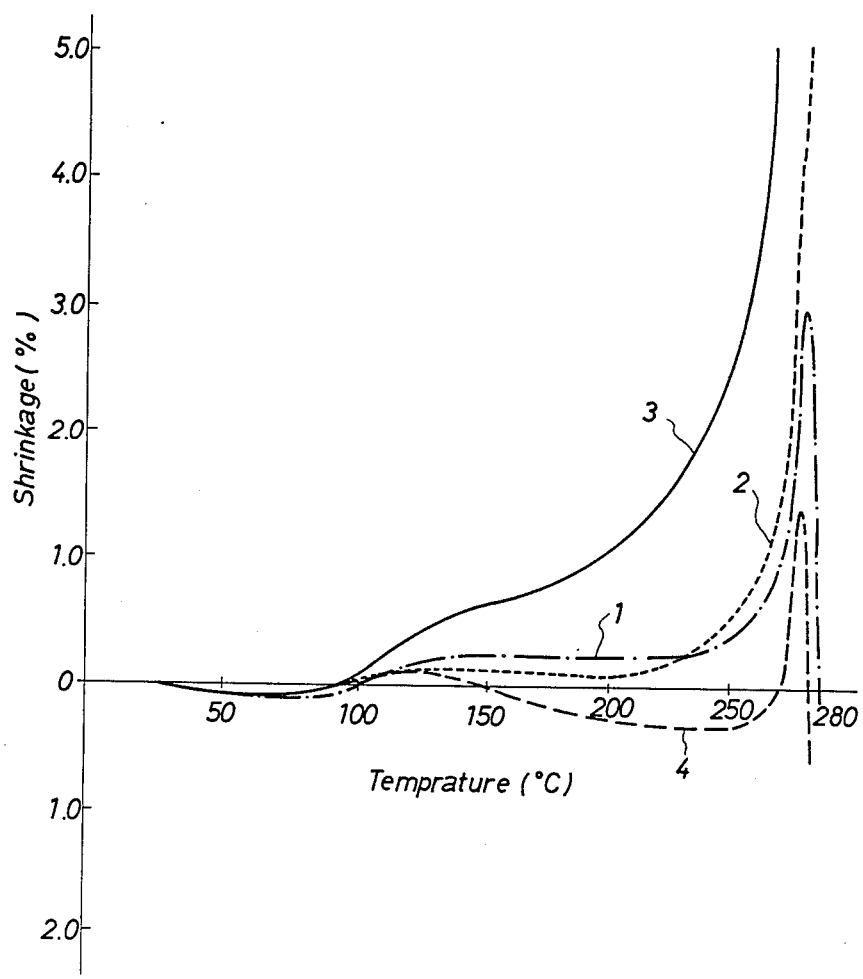
FIG. 1 is a drawing showing the relation between heat-setting temperature (°C.) and shrinkage (%).

The polymer of the biaxially oriented paraphenylene sulfide block copolymer film according to the present invention is essentially composed of recurring units (A):

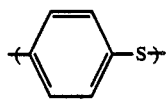

and recurring units (B):

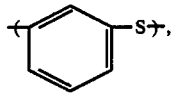

in which the recurring units (A) exist as a bonded blocks of average 20–2,000 units of the recurring unit (A) in the molecular chain and the molar fraction of recurring units (A) is in the range of 0.50–0.98, and has a melt viscosity ($\eta^*$) of 1,000–15,000 poises as measured at 310° C. and shear rate of 200 sec$^{-1}$, a glass transition temperature of 20°–80° C., a crystalline melting point of 250°–285° C. and a crystallization index of 15–45 (measured with the non-stretched heat-treated polymer film).

The crystalline p-phenylene sulfide block copolymer of the present invention is a high-molecular material having a chemical structure in which the recurring units (A):

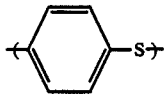

are bonded block-wise in the molecular chain.

For providing this copolymer with heat resistance based on crystallinity characteristic of p-phenylene sulfide homopolymer and with the working easeability in inflation film forming, melt extruding and molding, wire coating, melt spinning and drawing, etc., it is indispensable that the p-phenylene sulfide recurring units (A) of this copolymer be distributed in the molecular chain as bonded blocks of 20–2,000 units, preferably 40–1,500 units, more preferably 100–1,000 units on the average.

It is also necessary that the molar fraction of the recurring units (A) in the copolymer molecular chain is in the range of 0.50–0.98, preferably 0.60–0.90. When the p-phenylene sulfide recurring units are in the above-mentioned range, this copolymer has crystallinity and heat resistance equal to a p-phenylene sulfide homopolymer and is also excellent in workability for inflation film forming, melt extrusion, wire coating, melt spinning and drawing, etc.

The recurring units (B) which constitute the block copolymer with the p-phenylene sulfide recurring units (A), essentially comprise meta-phenylene sulfide recurring units:

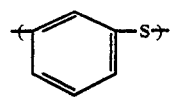

in which aromatic compound recurring units: —Ar—S— may be contained. In this formula, Ar represents an aromatic compound residue. Typical examples of —Ar—S— may exemplify

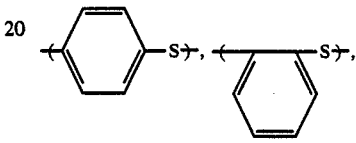

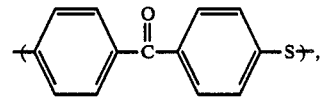

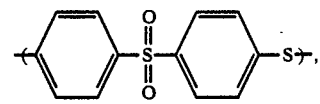

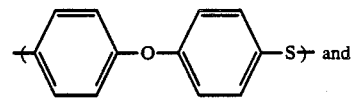

The term "essentially" is used in the present invention to signify that m-phenylene sulfide units occupy not less than 80% by mole, preferably 90 to 100% by mole of the whole recurring units (B).

The polymerization degree of the paraphenylene sulfide block copolymer of the present invention, as expressed in terms of melt viscosity ($\eta^*$), is in the range of 1,000–15,000 poises. The melt viscosity ($\eta^*$) is represented as measured under the conditions of 310° C. and shear rate of 200 sec$^{-1}$ by using a Koka-type flowtester. If the melt viscosity ($\eta^*$) is less than 1,000 poises, no tenacious molded product can be obtained.

The number of the recurring units (A):

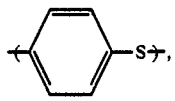

that is, the polymerization degree of poly-paraphenylene sulfide blocks in the block copolymer of the present invention can be determined by the fluorescent X-ray method, and the polymerization degree of poly-metaphenylene sulfide blocks (B) can be measured by gel permeation chromatography (GPC). The molar fraction of poly-paraphenylene sulfide blocks can be easily determined by infrared analysis.

Further, the paraphenylene sulfide block copolymer of the present invention has a glass transition temperature (Tg) of 20°–80° C. and a crystalline melting point (Tm) of 250°–285° C., and a crystalline index (Ci) of 15–45 (measured with the non-stretched heat treated polymer film).

The paraphenylene sulfide block copolymer of the present invention is also characterized by the fact that the crystallization temperature (Tc2) on the high temperature side (viz. the temperature at which the crystallization begins when the polymer in the molten state is cooled gradually) is widely different from the crystalline melting point (Tm) and also the crystallization rate is not so high, in contrast in contrast to p-phenylene sulfide homopolymers in which Tc2 is close to Tm and the crystallization rate is very high. Therefore, the paraphenylene sulfide block copolymer of the present invention has a very advantageous working characteristic that it can be well molded and worked even in the temperature region between Tm and Tc2, that is, in the supercooling temperature range, and is thus suited for various types of working.

Tm, Tg, Tc1 and Tc2 are the values expressed by the melt peak, the temperature causing the start of heat absorption and the crystallization peak, respectively, as they were measured with 10 mg of specimen, which has been quenched from the molten state into a substantially noncrystalline (amorphous) state, under nitrogen gas atmosphere at a heating and cooling rate of 10° C./min by using a differential scanning type calorimeter mfd. by Metler Corp. (DSC Metler TA-3000).

The crystallization index (Ci) of the paraphenylene sulfide block copolymer of the present invention, which has been heat-treated but not stretched, is in the range of 15–45. This crystallization index (Ci) is a value calculated from the formula: $Ci=[Ac/(Ac+Aa)]\times 100$, by separating the crystalline scattering strength (Ac) and non-crystalline scattering strength (Aa) at $2\theta=17-23$ from the X-ray diffraction pattern [J. Appl. Poly. Sci., 20, 2545 (1976)]. Ci shown in the present invention is the value obtained from the measurement on the heat-treated film made by melt pressing the block copolymer by a high-temperature press at a temperature about 30° C. higher than the melting point, rapidly cooling the thus melt pressed film with water to form a 0.1–0.2 mm thick film, and heat treating the thus obtained film for 20 min at a temperature 20° C. lower than the melting point for effecting crystallization. In the case of the oriented and then heat-treated film, Ci is higher, usually in the range of 40–90.

Typical examples of the preparation process of paraphenylene sulfide block copolymer according to the present invention are shown below.

(I) A non-protonic polar organic solvent containing paradihalobenzene and an alkaline metal sulfide is heated to produce a reaction solution (C) containing a paraphenylene sulfide polymer in which the number of recurring units (A):

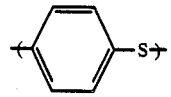

is 20–2,000 on the average (first step), and this reaction solution (C) is added with a dihalo aromatic compound substantially composed of metadihalobenzene and the thus obtained mixture is heated for effecting block copolymerization so as to obtain a paraphenylene sulfide block copolymer comprising the recurring units (A):

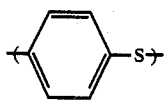

and recurring units (B):

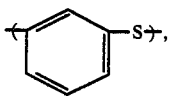

in which the molar fraction of recurring units (A) is in the range of 0.50–0.98, and having a melt viscosity ($\eta^*$) of 1,000–15,000 as measured under the conditions of 310° C. and shear rate of 200 sec$^{-1}$, a glass transition temperature (Tg) of 20°–80° C., a crystalline melting point (Tm) of 250°–285° C., and a crystallization index (Ci) of 15–45 (measured with the non-stretched heat-treated polymer film).

(II) A non-protonic polar organic solvent containing a dihalo aromatic compound composed of metadihalobenzene and an alkaline metal sulfide is heated to produce a reaction solution (E) containing a metaphenylene sulfide polymer comprising recurring units (B):

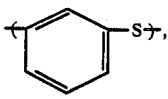

having an average polymerization degree of not less than 2 and satisfying the relation of $$\left(20\times\frac{1-Y}{Y}\right)\sim\left(2,000\times\frac{1-Y}{Y}\right)$$

(wherein Y is the molar fraction of recurring units (A) of the produced block copolymer, of 0.50–0.98) (first step), and this reaction solution (E) is added with paradihalobenzene and the thus obtained mixture is heated for effecting block polymerization so as to obtain a paraphenylene sulfide block copolymer comprising the recurring units (B):

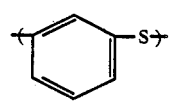

and recurring units (A):

in which the molar fraction of recurring units (A) is in the range of 0.50–0.98, and having a melt viscosity ($\eta^*$) of 1,000–15,000 as measured at 310° C. and shear rate of 200 sec$^{-1}$, a glass transition temperature (Tg) of 20°–80° C., a crystalline melting point (Tm) of 250°–285° C., a crystallization index (Ci) of 15–45 (measured with the non-stretched heattreated polymer film).

The alkaline metal sulfide used as sulfide bond supply source is preferably selected from the sulfides of such metals as Na, Li, K, Rb and the like, among which the sulfides of Na and Li are especially preferred in view of reactivity. In case such sulfide contains crystal water, it is necessary to reduce its water content by suitable means such as evaporation or drying before it is used for the polymerization reaction.

Carboxylic acid amides, organophosphoric acid amides, urea derivatives and the like can be preferably used as non-protonic polar organic solvent in the reaction, but in view of chemical and thermal stability, N-methylpyrrolidone, hexatrimethylphosphoric acid triamide, tetramethylurea and the like are especially preferred.

In the dihalo aromatic compound, paradichlorobenzene, paradibromobenzene and the like can be used as paradihalobenzene for forming the p-phenylene sulfide blocks, while dihalo substituted aromatic compounds can be used in a small quantity with the above-mentioned metadihalobenzene for forming other blocks. Typical examples of such dihalo substituted aromatic compounds are those shown by the formulae:

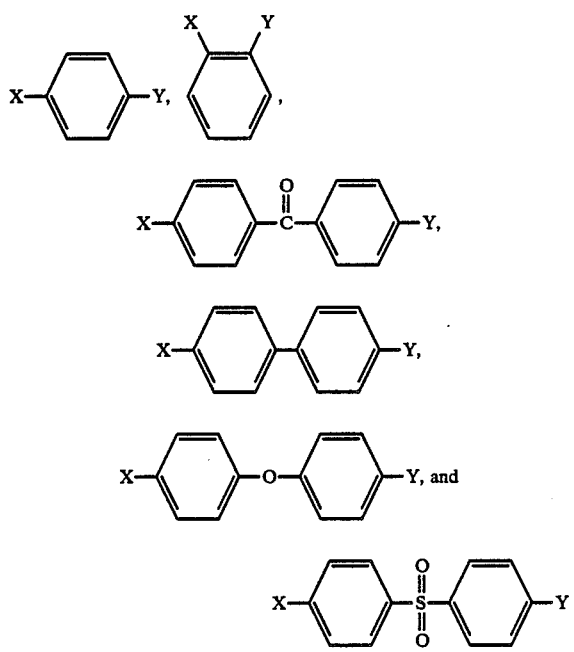

(wherein X and Y are each a halogen atom).

It is also possible to use polyfunctional compounds having three or more halogen groups such as 1,2,3- or 1,2,4-trihalobenzene.

The polymerization conditions should be selected so that a polymer having a melt viscosity ($\eta^*$) of 1,000–15,000 poises, preferably 1,050–15,000 poises, is formed.

The preparation processes will be described more particularly below.

Preparation process (I)

In case of using an alkaline metal sulfide containing crystal water as starting material, such as Na$_2$S.9H$_2$O, Na$_2$S.5H$_2$O and Na$_2$S.3H$_2$O (including those produced from an in situ reaction of NaHS.2H$_2$O+NaOH→Na$_2$S.3H$_2$O), it is preferable (i) to reduce the water content to a proper level by drying and then feed the thus dried compound into an organic solvent, (ii) to feed the alkaline metal sulfide alone into an organic solvent and heat the thus obtained mixture to about 200° C. thereby distilling off water, or (iii) to carry out chemical dehydration by adding, for example, CaO thereby properly adjusting the water content (usually 0.5–2.5 moles to one mole of sulfide). Thereafter, p-dihalobenzene is added thereto in an amount corresponding to 0.95–1.05 moles to one mole of sulfide, and the mixture is heated to a proper temperature, usually 160°–300° C., preferably 190°–260° C., to carry out polymerization reaction until the average polymerization degree of the produced p-phenylene sulfide prepolymer becomes 20–2,000, thereby forming a prepolymer-containing reacted mixture solution (C). The time required for this process is usually about 0.5–30 hours.

On the other hand, an unreacted mixture solution (D) is prepared by adding metadihalobenzene (which may contain a small quantity of dihalo substituted aromatic compound) to the starting alkali metal sulfide in an amount corresponding to 0.95–1.05 mole to one mole of sulfide, after adjusting its water content by drying, distillation in the organic solvent or chemical dehydration in the same way as described above.

The unreacted mixture solution (D) and the prepolymer-containing reaction mixture solution (C) are mixed in a proper ratio (viz. a ratio selected such that the molar fraction of paraphenylene sulfide recurring units in the produced block copolymer would become 0.50–0.98), and after re-adjusting the water content if necessary, the mixture is again heated to a proper temperature, usually 160°–300° C., preferably 200°–280° C., to carry out polymerization reaction. There can resultantly be obtained a crystalline paraphenylene sulfide block copolymer of the present invention.

The polymer can be recovered in a granular or powdery form by subjecting the thus obtained polymer to neutralization, filtration, washing and drying as desired in the conventional method.

Preparation process (II)

Assuming that the average length (polymerization degree) of the blocks of paraphenylene sulfide recurring units (A) is n, the molar fraction is Y and the average length (polymerization degree) of the blocks of recurring units (B) mainly composed of metaphenylene sulfide is m, there generally exists the following relation:

$$n:m = Y:(1 - Y)$$

$$\therefore m = n \times \frac{(1 - Y)}{Y}$$

Therefore, in the case of a block polymer in which n=20–2,000, there exists the relation:

$$m = \left(20 \times \frac{1-Y}{Y}\right) \sim \left(2{,}000 \times \frac{1-Y}{Y}\right)$$

(m must not be less than 2). This relation is applied in the preparation process (II).

In this process, as the case of the preparation process (I), a polar organic solvent and a starting alkaline metal sulfide are fed after properly adjusting the water content thereof, and then metadihalobenzene (which may contain a small quantity of dihalo substituted aromatic compound) is added thereto in an amount corresponding to usually 0.95–1.05 mole to one mole of sulfide. Then the mixture is heated to a proper temperature, usually 160°–300° C., preferably 190°–260° C., to carry out polymerization reaction until the average polymerization degree of the produced arylene sulfide prepolymer would become $$\left(20 \times \frac{1-Y}{Y}\right) \sim \left(2{,}000 \times \frac{1-Y}{Y}\right),$$

thereby preparing a prepolymercontaining reaction mixture solution (E).

On the other hand, an unreacted mixture solution (F) is prepared by feeding a polar organic solvent and a starting alkaline metal sulfide after adjusting the water content thereof in the same way as the preparation process (I) and then adding p-dihalobenzene thereto in an amount corresponding to usually 0.95–1.05 mole to one mole of sulfide. (As mentioned before, the essential component of the mixture solution (F) may be p-dihalobenzene alone, with no sulfide and solvent contained).

The unreacted mixture solution (F) and the prepolymer-containing reaction mixture solution (E) are mixed in a predetermined ratio, and after re-adjusting the water content thereof, if necessary, the mixture is again heated to a proper temperature, usually 160°–300° C., preferably 200°–280° C., to accomplish polymerization reaction, thereby obtaining a crystalline p-phenylene sulfide block copolymer of the present invention. Recovery and purification of the polymer can be performed in the same way as preparation process (I).

The thus produced polyphenylene sulfide block copolymer is melted by heating to the crystalline melting point (Tm) or higher and then molded into a sheet or film by a T-die or the like joined to a press or an extruder, and the thus molded material is cooled rapidly to produce a non-crystalline (amorphous) film or sheet. This rapid cooling is preferably conducted at a cooling rate of at least 10° C./sec to provide a transparent sheet with a crystallization degree of not more than 20%. If the cooling rate is lower than 10° C./sec, the growth of crystal is advanced and causes opacification and embrittlement of the produced film.

The thus obtained non-crystalline (amorphous) transparent sheet is stretched at a temperature of 85°–110° C. by rolling or tentering, and then heat-set at a temperature which is in the range of 250°–275° C. and further defined by the formula:

$$200 + 15 \log \eta^* \leq T_{HS} \leq 182.5 + 22.5 \log \eta^*$$

(wherein $T_{HS}$ is heat-setting temperature, and $\eta^*$ is melt viscosity as measured at 310° C. and shear rate of 200 sec$^{-1}$). In this way, it is possible to obtain a biaxially oriented paraphenylene sulfide block copolymer film showing a heat shrinkage of 0–2.0%, preferably 0.1–1.8%, at 100°–220° C., comprising a paraphenylene sulfide block copolymer essentially composed of recurring units (A):

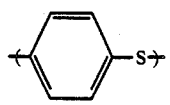

and recurring units (B):

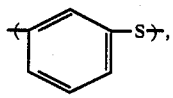

the molar fraction of recurring units (A) being 0.50–0.98, preferably 0.70–0.90, and having a melt viscosity ($\eta^*$) of 1,000–15,000 poises as measured at 310° C. and shear rate of 200 sec$^{-1}$, a glass transition temperature (Tg) of 20°–80° C., preferably 45°–80° C., a crystalline melting point (Tm) of 250°–285° C., preferably 265°–278° C., and a crystallization index (Ci) of 15–45, preferably 20–45 (measured with the non-stretched heat-treated polymer film).

Since the heat-set film which expands in the temperature of 100°–220° C. (heat shrinkage <0) may not adhere to the cooling metal roll in the working heat treatment such as vacuum evaporation (deposition), such a film is not preferable. Also, the oriented film showing a heat shrinkage of more than 2.0% is undesirable in respect of work precision.

By stretching the film usually not less than 6 times, preferably not less than 8 times as large as the original surface area of the film, it is possible to obtain a stretched film having a high intra-facial tension of molecular chain. In the case of successively biaxially stretching, the first-stage stretching ratio is preferably not more than 5 times. If the first-stage stretching ratio is more than 5 times, there may be caused not only an increase of tension of molecular chain but also a highdegree crystallization or a whitening phenomenon which gives an adverse effect to the film in the second-stage stretching.

The drawing rate is preferably in the range of 500–20,000%/min. If it is lower than 500%/min, nonuniformity of orientation may be caused, while if the drawing rate is more than 20,000%/min, there may occur a whitening phenomenon or cut off the film.

The present invention is characterized in that the stretched film is heat-set at a temperature which is in the range of 250°–275° C. and further defined by the formula: $200 + 15 \log \eta^* \leq T_{HS} \leq 182.5 + 22.5 \log \eta^*$.

For obtaining a biaxially oriented polyphenylene sulfide block copolymer film showing a heat shrinkage of 0–2.0% at 100°–220° C. and having excellent dimensional stability in the working heat treatment such as vacuum evaporation and good workability, it is necessary to adjust the heat-setting temperature of the stretched film in a specific range in conformity to the melt viscosity.

For instance, the heat-setting temperature for a film comprising a polymer having a melt viscosity of 1,000 poises should be 250° C., and that of a film comprising a polymer having a melt viscosity of 2,500 poises should be 250.9°–258.9° C. Also, in the case of a film comprising a polymer having a melt viscosity of 7,600 poises, the heat-setting temperature should be defined to a relatively narrow range of 258.2°–269.8° C.

If the heat-setting temperature is less than 250° C., it is substantially difficult to obtain a film having excellent dimensional stability, and the obtained film is unsuited for use as a base film of a magnetic recording medium for high-density recording. Also, if the heat-setting temperature is more than 275° C., it is difficult to obtain a film which shows the desired shrinking behavior in the temperature of 100°–220° C. Even if the heat-setting temperature is in the range of 250°–275° C., no satisfactory shrinking behavior can be obtained unless the melt viscosity ($\eta^*$) of the film used is in a proper range. If the melt viscosity ($\eta^*$) is too low, no satisfactory shrinking behavior is shown even if heat-setting is conducted at 250° C., and there is obtained a film showing an expanding behavior. Further, if the melt viscosity ($\eta^*$) is too high, there is obtained a film which shows too large shrinkage for practical use. Such film is poor in dimensional stability or may break in the course of heat-setting treatment.

For obtaining a film showing a heat shrinkage of 0–2.0% at 100°–220° C., it is necessary to heat-set the film at a temperature specified by the above-mentioned formula which accords with the melting behavior of the film used. When heat-setting is conducted in this temperature range, there can be obtained a film showing a proper shrinking behavior, and when such film is subjected to a metallization treatment (metal vacuum evaporation) at a high temperature, the film can well adhere to the cooling metal roll and therefore the cooling effect by the roll is enhanced to facilitate the metallization treatment.

The heat-setting time, though variable according to the desired properties of the produced film, is usually in the range from 3 seconds to several ten minutes, preferable 3–600 seconds. By the heat-setting treatment of from 3 seconds to several ten minutes, there mainly takes place crystallization and a thermally stabilized film can be obtained. If the heat-setting time is longer than the above-mentioned range, there may take place undesirable phenomena such as excessive coloration or embrittlement of the film.

The present invention provides a biaxially oriented paraphenylene sulfide block copolymer film showing a heat shrinkage of 0–2% and a process for producing such film. By using the biaxially oriented paraphenylene sulfide block copolymer film as base film and depositing thereon Fe, Ni, Co, their alloys or a ferromagnetic compound such as ferrite, it is possible to produce a base film of a magnetic recording medium for high-density recording.

The present invention will hereinafter be described according to the examples thereof. These examples, however, are merely illustrative and not limitive of the scope of the invention.

Synthesis Example 1

8.0 kg of N-methylpyrrolidone (NMP) and 21.0 moles of Na$_2$S.5H$_2$O were supplied into a 20-liter polymerization pressure vessel and heated to about 200° C. to distil off water (loss of S=1.5 mol %; water in the vessel=28 moles). Then 20.1 moles of m-dichlorobenzene (m-DCB) and 3.1 kg of NMP (calcd. Na$_2$S concentration in the mixed solution=1.342 mol/kg) were supplied thereto, and after the vessel atmosphere replacement with N$_2$, the mixture was polymerized at 220° C. for one hour and then further reacted at 230° C. for 9 hours to prepare a reaction mixture solution (E-1). This solution was taken out from the vessel and stored.

A small amount of (E-1) solution was sampled out and the polymerization degree of the produced m-phenylene sulfide prepolymer was measured (by GPC method). The polymerization degree was 30.

8.0 kg of NMP and 20.0 moles of Na$_2$S.5H$_2$O were fed into a 20-liter polymerization pressure vessel and heated to about 200° C. to distil off water (loss of S=1.5 mol %; water in the vessel=26 moles). Then 20.29 moles of p-dichlorobenzene (p-DCB), 3.55 moles of water and 2.75 kg of NMP were supplied thereto (mole ration of p-DCB to Na$_2$S in the mixture is 1.03); and the mixture was cooled under stirring. The Na$_2$S concentration in the mixed solution was 1.322 mol/kg. The solution was taken out from the vessel and mixed well to prepare an unreacted mixture solution (F-1).

The reaction mixture solution (E-1) and unreacted mixture solution (F-1) were supplied in a ratio of 2.25 kg (E-1) to 12.58 kg (F-1) into a 20-liter polymerization pressure vessel, and the mixture was reacted at 215° C. for 10 hours, then 1.24 kg of water was added thereto and the thus obtained mixture was further reacted at 260° C. for 5 hours.

The thus obtained reaction mixture was filtered, washed with hot water and dried under reduced pressure to obtain the block copolymer.

The molar fraction (X) of the recurring units:

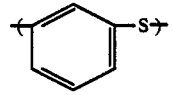

in the blocks, as measured by infrared analysis, was 0.15. The melt viscosity ($\eta^*$) as measured at 310° C. and shear rate of 200 sec$^{-1}$ by using a Koka type flowtester was 1,800 poises.

Snythesis Examples 2–4

Unreacted mixture solutions (F-1) were prepared in the same was as in Synthesis Example 1 except that the p-DCB to Na$_2$S molar ratio was changed to 1.02, 1.015 and 1.01, respectively, and each of these unreacted mixture solutions (F-1) was supplied along with the reaction mixture solution (E-1) into a 20-liter polymerization pressure vessel so that the mixture would contain 15 mol % of recurring units (B):

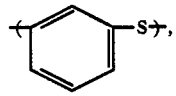

and they were reacted in the same way as in Synthesis Example 1 to obtain the corresponding block copolymers.

Synthesis Example 5

8.0 kg of N-methylpyrrolidone (NMP) and 20.0 moles of Na$_2$S.5H$_2$O were supplied into a 20-liter polymerization pressure vessel and heated to about 200° C. to distil off water (loss of S=1.5 mol %; water in the vessel=26.4 moles). Then 20.1 moles of p-dichlorobenzene (p-DCB), 3.15 moles of water and 2.5 kg of NMP were supplied (Na$_2$S concentration in the mixture=1.325 mol/kg), and after atmosphere replacement with N$_2$, the mixture was polymerized at 210° C. for 10 hours to prepare a reaction mixture solution (C-1). This (C-1) solution was taken off from the vessel and stored. A small amount of (C-1) solution was sampled out and the polymerization degree of the produced p-phenylene sulfide prepolymer was measured (by fluorescent X-ray method). It was 110.

8.0 kg of NMP and 21.0 moles of Na$_2$S.5H$_2$O were supplied into a 20-liter polymerization pressure vessel and heated to about 200° C. to distill off water (loss of S=1.5 mol %; water in the vessel=28.5 moles). Then 20.685 moles of m-DCB and 3.0 kg of NMP were supplied (Na$_2$S concentration in the mixture=1.334 mol/kg), and the mixture was cooled under stirring to prepare an unreacted mixture solution (D-1). The solution was taken out of the vessel and stored.

The reaction mixture solution (C-1) and the unreacted mixture solution (D-1) were supplied in a ratio of 13.91 kg (C-1) to 2.25 kg (D-1) into a 20-liter polymerization pressure vessel and reacted at 225° C. for 10 hours, then added with 1.35 kg of water and further reacted at 260° C. for 5 hours. The reaction mixture was filtered, washed with hot water and dried under reduced pressure to obtain a block copolymer.

The obtained block copolymers were melted at a temperature by about 30° C. higher than the melting point and pressed by a high-temperature press and then cooled rapidly with water to make 0.1–0.2 mm thick films. By using the thus obtained film as samples, the copolymer compositions were determined by infrared analysis (FT-IR method). Tg, Tm, Tc1 and Tc2 were also determined by using these samples.

Each film was heat treated at a temperature 20° C. lower than the melting point for 20 minutes for effecting crystallization and the crystallization index Ci of the heat treated sheet was determined by X-ray diffractometry.

The results of determinations are shown in Table 1.

of 305° C. to form 245 mm thick T-die sheets. Each of these sheets was biaxially stretched 3.5 times in the longitudinal and transverse directions simultaneously at a stretching temperature of 95° C., drawing rate of 2,300%/min and preheating time of 1 minute by using a film stretcher mfd. by T. M. Long & Inc. The thus obtained stretched films were respectively fixed to a metal frame and heated at 260° C. for 10 minutes in the case of the films of block copolymers of Synthesis Examples 1–4 and at 250° C. for 10 minutes in the case of the film of block copolymer of Snythesis Example 5 to obtain transparent films. The film thickness was about 20 μm.

A film piece of 5 mm in width and 20 mm in length was cut out from each of the thus obtained biaxially stretched film [(1) η*=3,200 poises (Example 1), (2) η*=4,600 poises (Example 2), (3) η*=7,600 poises (Example 3), and (4) η*=1,800 poises (Comparative Example 1)], and each film piece was heated at a heating rate of 10° C./min under a load of about 30 g/mm$^2$ by using TMA (thermal machine analyzer, mfd. by Shimazu Co., Ltd.) to determine the thermal expansion/contraction behavior.

The results of determinations are shown in FIG. 1. The film of Example 4 (η*=1,300 poises) obtained from the block copolymer of Synthesis Example 5 showed a heat shrinkage of 0.1% at 100° C. and 0.5% at 220° C., and the heat shrinkage in this temperature range was 0.1–0.5%. Each film expands until it is heated to the temperature at which the molecular motion of the non-crystalline portion becomes active (that is, till reaching the glass transition temperature). Above the glass transition temperature, the expansion/contraction behavior differs according to the working conditions. When the film is further heated, crystal begins to melt and a sharp shrinkage occurs.

As seen from FIG. 1, in the case of the film of Comparative Example 1 which has been heat-set at a temperature outside the heat-setting temperature range specified in the present invention (shown by 4 in FIG. 1; the film was heat-set at a higher temperature than the tem-

TABLE 1

| Synthesis Example No. | Na$_2$S/p-DCB molar ratio in unreacted mixture solution (F-1) | Mole % of 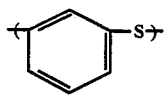-S- in block copolymer | η* | Tg | Tm | Tc1 | Tc2 | Ci |
|---|---|---|---|---|---|---|---|---|
| 1 | 1.03 | 15 | 1800 | 72 | 276 | 128 | 208 | 35 |
| 2 | 1.02 | 15 | 3200 | 75 | 275 | 130 | 202 | 33 |
| 3 | 1.015 | 15 | 4600 | 74 | 275 | 129 | 200 | 35 |
| 4 | 1.01 | 15 | 7600 | 75 | 274 | 128 | 203 | 34 |
| 5 | — | 14 | 1300 | 73 | 275 | 128 | 204 | 35 |

Examples 1–4 & Comparative Example 1

Polyphenylene sulfide block copolymers containing 14 and 15 mole % of recurring units:

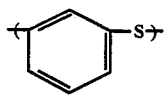

and having different melt viscosities, obtained in Synthesis Examples 1–5, were extruded onto a 75°–85° C. casting roll through a 35 mmφ extruder provided with a hard chrominum plated screw at a resin temperature perature range specified in the present invention), thermal expansion occurred and the adhesion to the metal roll became poor at higher than 150° C. Thus, this film was unsuited for metallization (metal vacuum deposition) at high temperature.

In the case of the films of Examples 1–3 (the film of Example 1 being shown by 1, the film of Example 2 being shown by 2 and the film of Example 3 being shown by 3 in FIG. 1) and the film of Example 4, which were all heat-set in the temperature range specified in the present invention, the heat shrinkage was 0–2% in the temperature range of 100°–220° C. and the adhesion to the metal roll was also excellent. Thus, these films were suited for metallization (metal vacuum deposition) at high temperature.

What is claimed is:

1. A biaxially oriented paraphenylene sulfide block copolymer film showing a heat shrinkage of 0-2.0% at 100°-220° C., comprising a paraphenylene sulfide block copolymer essentially composed of recurring units (A):

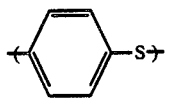

and recurring units (B):

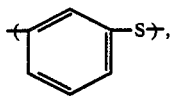

the molar fraction of recurring units (A) being 0.50-0.98, and having a melt viscosity ($\eta^*$) of 1,000-15,000 poises as measured at 310° C. and a shear rate of 200 sec$^{-1}$, a glass transition temperature (Tg) of 20°-80° C., a crystalline melting point (Tm) of 250°-285° C. and a crystallization index (Ci) of 15-45 (measured with the non-stretched heat-treated polymer film).

2. A biaxially oriented paraphenylene sulfide block copolymer film according to claim 1, showing a heat shrinkage of 0.1-1.8% at 100°-220° C.

3. A process for producing a biaxially oriented paraphenylene sulfide block copolymer film showing a heat shrinkage of 0-2.0% at 100°-220° C., which comprises melt extruding and molding into a film a paraphenylene sulfide block copolymer essentially composed of recurring units (A):

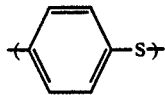

and recurring units (B):

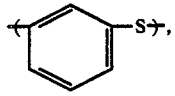

the molar fraction of recurring units (A) being 0.50-0.98, and having a melt viscosity ($\eta^*$) of 1,000-15,000 poises as measured at 310° C. and shear rate of 200 sec$^{-1}$, a glass transition temperature (Tg) of 20°-80° C., a crystalline melting point (Tm) of 250°-285° C. and a crystallization index (Ci) of 15-45 (measured with the non-stretched heat-treated polymer film), cooling the thus molded film to form a non-crystalline film, stretching the thus obtained film and then heat-setting the thus stretched film at a temperature which is in the range of 250°-275° C. and further defined by the formula:

$$200 + 15 \log \eta^* \leq T_{HS} \leq 182.5 + 22.5 \log \eta^*$$

(wherein $T_{HS}$ is heat-setting temperature, and $\eta^*$ is melting viscosity as measured at 310° C. and shear rate of 200 sec$^{-1}$).

4. A process according to claim 3, wherein cooling of the thus molded film of paraphenylene sulfide block copolymer is carried out at a cooling rate of at least 10° C./sec.

5. The process according to claim 3, wherein the molded film is biaxially stretched not less than 6 times as large as the original surface area.

6. The process according to claim 3, wherein said stretching is carried out at a drawing rate of 500-20,000%/min.

7. A process according to claim 3, wherein said stretching is carried out at 85°-110° C.

8. A process according to claim 3, wherein said heat-setting is conducted for a period of 3 seconds to 10 minutes.

9. A biaxially oriented paraphenylene sulfide block copolymer film produced by the process of claim 3.

10. The biaxially oriented paraphenylene sulfide block copolymer film of claim 1, wherein said paraphenylene sulfide block copolymer comprises blocks of para-phenylene sulfide of 20 to 2,000 units on average per block.

11. The biaxially oriented paraphenylene sulfide block copolymer film of claim 1, wherein said paraphenylene sulfide block copolymer comprises blocks of para-phenylene sulfide of 40 to 1,500 units on average per block.

12. The biaxially oriented paraphenylene sulfide block copolymer film of claim 1, wherein said paraphenylene sulfide block copolymer comprises blocks of para-phenylene sulfide of 100 to 1,000 units on average per block.

13. The biaxially oriented paraphenylene sulfide block copolymer film of claim 1, wherein the molar fraction of recurring units (A) is from 0.60-0.90.

14. The biaxially oriented paraphenylene sulfide block copolymer film of claim 1, wherein said recurring units (B) comprises aromatic compound recurring units: —(Ar—S—)— in which Ar is an aromatic compound residue.

15. The biaxially oriented paraphenylene sulfide block copolymer film of claim 14, wherein —(Ar—S—)— is at least one member selected from the group consisting of

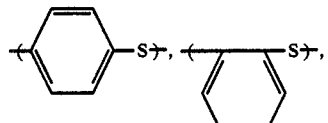

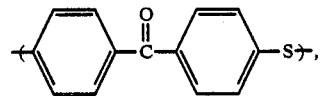

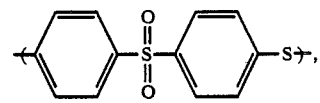

-continued
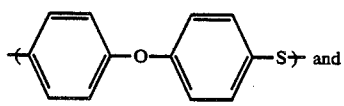 and
-continued
16. The biaxially oriented paraphenylene sulfide block copolymer film of claim 15, wherein said recurring units (B) comprises not less than 80 molar % of meta-phenylene sulfide.
* * * * *